United States Patent [19]

Koshikawa

[11] Patent Number: 5,467,468
[45] Date of Patent: Nov. 14, 1995

[54] SEMICONDUCTOR MEMORY DEVICE HAVING BUILT-IN TEST CIRCUITS SELECTIVELY ACTIVATED BY DECODER CIRCUIT

[75] Inventor: Yasuji Koshikawa, Tokyo, Japan

[73] Assignee: NEC Corporation, Tokyo, Japan

[21] Appl. No.: 22,622

[22] Filed: Feb. 25, 1993

[30] Foreign Application Priority Data

Feb. 27, 1992 [JP] Japan .................................. 4-076104

[51] Int. Cl.⁶ ........................... G01R 31/28; G06F 11/00
[52] U.S. Cl. ........................................ 371/22.3; 395/375
[58] Field of Search .................................. 371/15.1, 22.5, 371/22.6, 21.1; 365/201, 202; 395/575

[56] References Cited

U.S. PATENT DOCUMENTS

5,175,840  12/1992  Sawase et al. ........................ 395/425
5,272,673  12/1993  Sugibayashi .......................... 365/201
5,299,163   3/1994  Mortigami ............................ 365/201

*Primary Examiner*—Robert W. Beausoliel, Jr.
*Assistant Examiner*—Trinh Tu
*Attorney, Agent, or Firm*—Sughrue, Mion, Zinn, Macpeak & Seas

[57] ABSTRACT

A dynamic random access memory device internally carries out inspection sequences in a diagnostic mode of operation, and an instruction circuit incorporated therein discriminates a Write-CAS-Before-RAS entry cycle for simultaneously supplying test enable signals indicative of inspection sequences to internal test circuits, wherein the instruction circuit firstly decodes a multi-bit instruction signal and repeatedly produces a latch control signal for sequentially storing the decoded signal so that a plurality of test enable signal are simultaneously supplied to the test circuits.

14 Claims, 7 Drawing Sheets

SEMICONDUCTOR MEMORY DEVICE HAVING BUILT-IN TEST CIRCUITS SELECTIVELY ACTIVATED BY DECODER CIRCUIT

FIELD OF THE INVENTION

This invention relates to a semiconductor memory device and, more particularly, to a semiconductor memory device equipped with a built-in diagnostic unit for internally diagnosing other component circuits.

DESCRIPTION OF THE RELATED ART

A semiconductor memory device such as a dynamic random access memory device is progressively increased in memory capacity, and the arrangement of peripheral circuits becomes complex. In order to guarantee the excellent quality of products, the large number of memory cells and the complex peripheral circuits are diagnosed upon completion of the fabrication process, and prolong time period for the diagnosis. The complex diagnosis consumes time and labor, and deteriorates the cost performance.

Various approaches have been proposed for improving the cost performance. One of the approaches is a built-in diagnostic unit which selectively carries out a plurality of inspection sequences in response to instructions supplied from the outside thereof. In one of the inspection sequences, a plurality of memory cells are concurrently accessed, and the read-out data bits are compared with one another to see whether or not one of the accessed memory cells inverts the logic level of the given test data bits. Another inspection sequence allows a test signal to skip some inverters forming parts of an internal delay path, and shortens the internal delay path, thereby virtually creating high temperature atmosphere without any heat application. Moreover, another semiconductor memory device is diagnosed under application of different bias voltage to the semiconductor substrate, because an origin of a defect becomes clear through acceleration of the defect.

Figure 1:
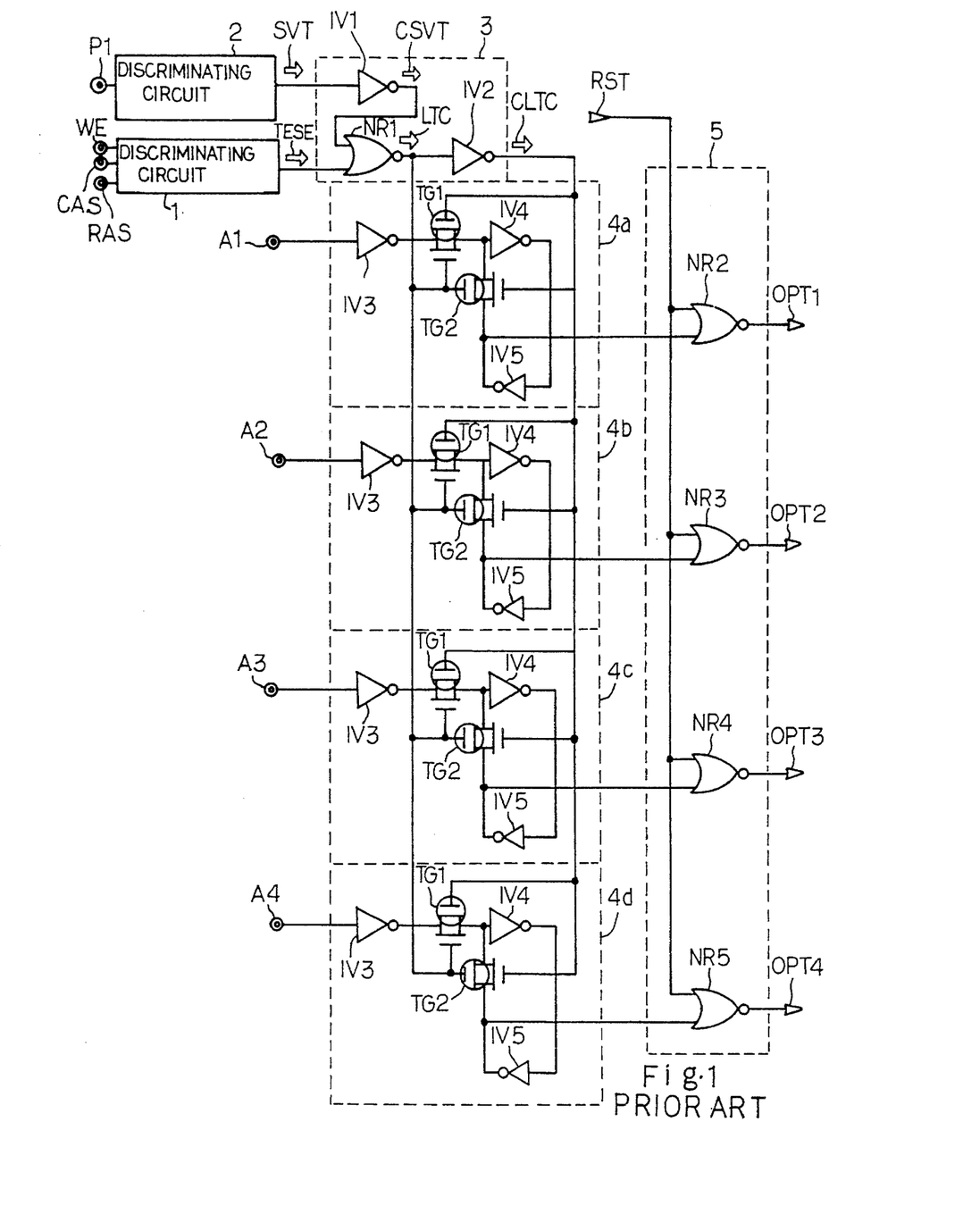
FIG. 1 is a circuit diagram showing the arrangement of the instruction circuit incorporated in the prior art dynamic random/access memory device.

In order to selectively carry out the inspection sequences, it is necessary for the diagnostic unit to provide a test mode entry cycle and a test mode reset cycle, and FIG. 1 illustrates an instruction circuit incorporated in the prior art dynamic random access memory device for the test mode entry cycle. The instruction circuit is responsive to a WCBR (Write-CAS-Before-RAS) entry cycle, and acknowledges the request for the diagnostic mode of operation.

The instruction circuit largely comprises a discriminating circuit 1 for the WCBR entry cycle, a discriminating circuit 2 for a super voltage, a control circuit 3, latch circuits 4a, 4b, 4c and 4d, and an output circuit 5. In the following description, low and high voltage level are assumed to correspond to logic "0" level and logic "1" level, respectively.

The discriminating circuit 1 monitors external signal pins WE, CAS and RAS assigned to a write enable signal, a column address strobe signal and a row address strobe signal, and produces a detecting signal TESE of active low voltage level when the row address strobe signal goes down to active low voltage level in the co-presence of the write enable signal and the column address strobe signal both already shifted to the active low voltage level. However, if the three external control signals RAS, CAS and WE goes up to the inactive high voltage level, the detecting signal TESE is recovered to the inactive high voltage level. The discriminating circuit 2 monitors a predetermined external pin P1, and produces a detecting signal SVT of active high voltage level when the voltage level at the pin P1 exceeds the ordinary voltage range of an external signal assigned the predetermined pin P1. The WCBR cycle and the super voltage over the ordinary voltage range do not concurrently take place in a standard mode of operation, and the dynamic random access memory device does not mistakenly enter the inspection sequences.

The control circuit 3 comprises an inverter circuit IV1 for producing a complementary signal CSVT of the detecting signal SVT, a NOR gate NR1 enabled with the complementary signal CSVT for producing a latch control signal LTC of active high voltage level in the presence of the detecting signal TESE of the active low voltage level, and an inverter circuit IV2 for producing a complementary signal CLTC of the latch control signal LTC. The latch control signal LTC and the complementary signal thereof are supplied to the latch circuits 4a to 4d for controlling the latch circuits 4a to 4d.

The latch circuits 4a to 4d are identical in circuit arrangement with one another, and are associated with four external address pins A1, A2, A3 and A4 respectively assigned to external address bits. Each of the latch circuits 4a to 4d comprises an inverter circuit IV3, coupled with the associated address pin A1, A2, A3 or A4, a memory loop implemented by two inverter circuits IV4 and IV5, a transfer gate TG1 implemented by a parallel combination of an n-channel enhancement type switching transistor and a p-channel type enhancement type switching transistor and coupled between the inverter circuit IV3 and the memory loop, and a transfer gate TG2 coupled between the inverter circuits IV4 and IV5. The transfer gates TG1 and TG2 are responsive to the latch control signal LTC and the complementary signal CLTC, and are complementarily switched between on-state and off-state. While the transfer gate TG1 is turned on and, accordingly, the transfer gate TG2 is turned off, the inverter circuit IV3 supplies an instruction signal through the transfer gate TG1 to the inverter circuit IV4, and the inverter circuit IV4 in turn supplies the complementary signal to the inverter circuit IV5. When the transfer gate TG1 turns off and, accordingly, the transfer gate TG 2 turns on, the inverter circuits IV4 and IV5 are coupled with one another, and the instruction signal is maintained in the memory loop.

The output circuit 5 comprises four two-input NOR gates NR2, NR3, NR4 and NR5, and are concurrently enabled or disabled with a reset signal RST. Namely, the reset signal RST is supplied to one of the two input nodes of each NOR gate NR2, NR3, NR4 or NR5, and the other input nodes of the four NOR gates NR2 to NR5 are coupled with the output nodes of the inverter circuits IV5 of the latch circuits 4a to 4d, respectively. When the WCBR entry cycle is acknowledged in the presence of the super voltage over the ordinary voltage range, the reset signal RST goes up to the active high voltage level for a moment, and is, thereafter, maintained in the inactive low voltage level until the WCBR cycle is acknowledged again. While the reset signal RST remains in the active high voltage level, the NOR gates NR2 to NR5 resets the previous instruction signals, and keeps first to fourth test enable signals OPT1 to OPT4 to the inactive low voltage level regardless of the instruction signals stored in the respective latch circuits 4a to 4d. However, when the reset signal RST goes down to the inactive low voltage level, the NOR gates NR2 to NR5 are concurrently enabled, and becomes responsive to the instruction signals stored in the latch circuits 4a to 4d so as to selectively change the first to fourth test enable signals OPT1 to OPT4. Though not shown in the drawings, the first to fourth test enable signals OPT1 to OPT4 are respectively supplied to four test circuits of the diagnostic unit, and allow the test circuits to selectively start the inspection sequences.

The instruction circuit thus arranged behaves as follows. Assuming now that the row address strobe signal RAS goes down to the active low voltage level in the copresence of the column address strobe signal CAS of the active low voltage level and the write enable signal WE of the active low voltage level at time t1 of FIG. 2, the discriminating circuit 1 acknowledges the WCBR entry cycle, and shifts the detecting signal TESE to the active low voltage level. If the super voltage over the ordinary voltage range has been already applied to the predetermined pin P1, the discriminating circuit 2 has changed the detecting signal SVT to the high voltage level, and the inverter circuit IV1 enables the NOR gate NR1 with the complementary signal CSVT. Therefore, the control circuit 3 supplies the latch control signal LTC of the active high voltage level and the complementary signal CLTC to the latch circuits 4a to 4d. As a result, the transfer gates TG1 turn on, and the inverter circuits IV3 are conducted with the associated memory loops.

If an analyst changes the instruction signals to the address pins A1 to A4 for requesting the diagnostic unit some of the inspection sequences immediately after time t1, the instruction signals are once inverted, and the complementary instruction signals are supplied from the inverter circuits IV3 to the memory loops of the latch circuits 4a to 4d. Then, the complementary instruction signals are stored in the memory loops of the latch circuits 4a to 4d.

Since the reset signal RST has been already maintained in the inactive low voltage level, the complementary instruction signals are supplied from the output nodes of the inverter circuits IV5 to the NOR gates NR2 to NR5, and the output circuit 5 changes some of the test enable signals OPT1 to OPT4 to the active high voltage level. With the test enable signals of the active high voltage level indicative of the requested inspection sequences, the diagnostic unit controls the inspection sequences, and the inspection sequences are parallelized. If the WCBR entry cycle is repeated again, the reset signal RST goes up to the high voltage level in a moment, and the NOR gates NR2 to NR5 resets the instruction signals.

Figure 2:
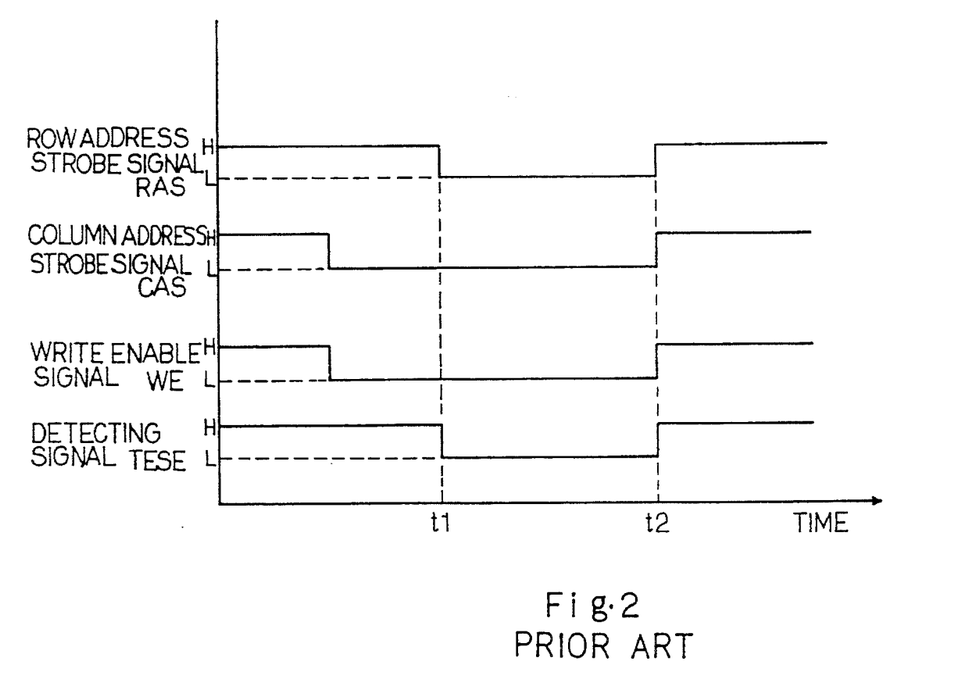
FIG. 2 is a timing chart showing the WCBR entry cycle for the prior random access memory device.

Thus, the analyst sequentially changes the instruction signals, and the inspection sequences are internally carried out by the diagnostic unit. Upon completion of all the inspection sequences, the row address strobe signal RAS, the column address strobe signal CAS and the write enable signal WE are concurrently recovered to the inactive high voltage level at time t2, and the super voltage is removed from the predetermined pin P1. The discriminating circuit I discriminates the reset cycle, and the detecting signal TESE is allowed to go up to the inactive high voltage level. As a result, the control circuit 3 blocks the memory loops of the latch circuits 4a to 4d from the address pins A1 to A4.

The prior art instruction circuit shown in FIG. 1 is employed with the WCBR entry cycle. However, another prior art instruction circuit discriminates a ROR (RAS-Only-Refresh) entry cycle, and selectively produces test enable signals. However, these prior art instruction circuits control the test enable signals equal in number to the instruction signals, and the external address pins limits the number of inspection sequences.

Another prior art dynamic random access memory device is equipped with a decoder circuit coupled with the external address pins, and increases the number of inspection sequences. However, the decoder allows only one test enable signal to go up to the active level, and the inspection sequences are serially carried out. This means that prolonged time period is necessary for the inspection sequences, and the inspection cost is increased due to low throughput.

SUMMARY OF THE INVENTION

It is therefore an important object of the present invention to provide a semiconductor memory device which carries out parallelized inspection sequences greater than external signal pins.

To accomplish the object, the present invention proposes to latch a decoded signal sequentially produced in synchronism with an enable signal.

In accordance with one aspect of the present invention, there is provided an instruction circuit incorporated in a semiconductor integrated circuit for selectively starting a plurality of internal inspection sequences, comprising: a) a decoder circuit coupled with first external signal pins of the semiconductor integrated circuit, and operative to repeatedly decode a multi-bit external instruction signal at the first external signal pins in the presence of an enable signal for sequentially producing decoded signals at a plurality of output nodes thereof; b) a control circuit coupled with second external signal pins of the semiconductor integrated circuit, and operative to discriminate a multi-bit request signal indicative of a request for internal diagnosis for producing the enable signal, the control circuit being further operative to produce a strobe signal while the internal diagnosis is requested; and c) a plurality of resettable memory means respectively coupled with the output nodes of the decoder circuit, and responsive to the strobe signal for storing the decoded signal, thereby simultaneously supplying test enable signals indicative of inspection sequences selected from the plurality of inspection sequences to a diagnostic unit incorporated in the semiconductor integrated circuit.

In accordance with another aspect of the present invention, there is provided a semiconductor memory device fabricated on a single semiconductor chip and selectively entering a standard mode and a diagnostic mode of operation, comprising: a) a memory cell array implemented by a plurality of memory cells; b) a plurality of peripheral circuits provided in association with the memory cell array for allowing an external device to selectively access data bits stored in the memory cell array in the standard mode of operation; c) a diagnostic unit having a plurality of test circuits respectively activated with a plurality of test enable signals in the diagnostic mode for respectively carrying out a plurality of inspection operations on the memory cell array and peripheral circuits selected from the plurality of peripheral circuits; and d) an instruction unit operative to simultaneously supply test enable signals selected from the plurality of test enable signals to the diagnostic unit in the diagnostic mode, and having d-1) a decoder circuit coupled with first external signal pins of the semiconductor memory device, and operative to decode a multi-bit instruction signal at the first external signal pins in the presence of an enable signal for sequentially producing decoded signals at a plurality of output nodes thereof, d-2) a control circuit coupled with second external signal pins of the semiconductor integrated circuit, and operative to discriminate a multi-bit request signal indicative of the diagnostic mode for producing the enable signal, the control circuit being further operative to produce a strobe signal in the presence of the multi-bit request signal, and d-3) a plurality of resettable memory means respectively coupled with the output nodes of the decoder circuit, and responsive to the strobe signal for storing the decoded signals, thereby simultaneously supplying the test enable signals to the diagnostic unit.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 3:
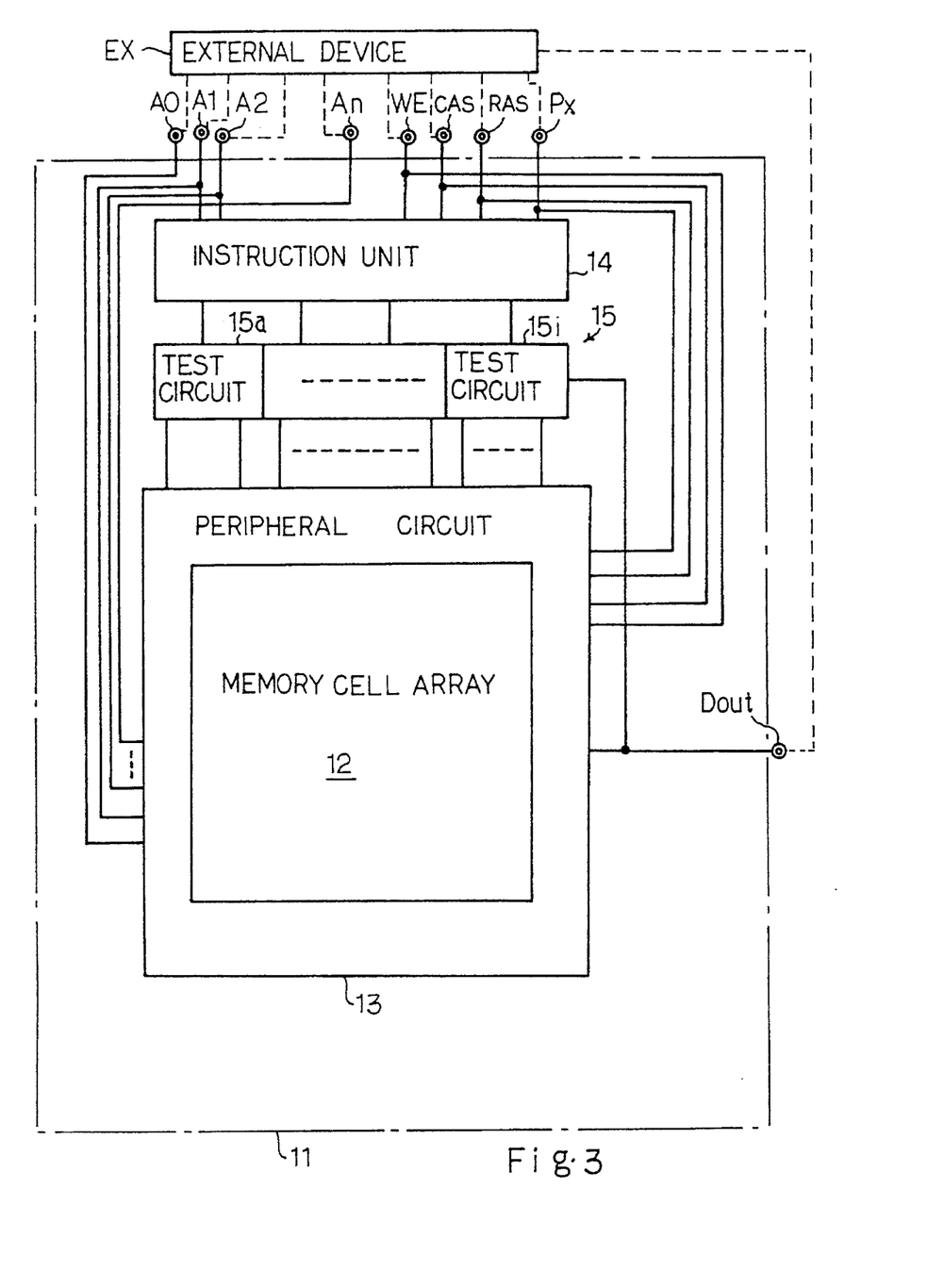
FIG. 3 is a block diagram showing a dynamic random access memory device according to the present invention.

Referring to FIG. 3 of the drawings, a dynamic random access memory device embodying the present invention is fabricated on a single semiconductor chip 11, and largely comprises a memory cell array 12, peripheral circuits 13, an instruction unit 14 and a diagnostic unit 15. The dynamic random access memory device selectively enters a standard mode and a diagnostic mode, and a read-out operation, a write-in operation and a refreshing operation are carried out in the standard mode. On the other hand, while the dynamic random access memory device stays in the diagnostic mode, various inspection sequences are carried out under the control of the diagnostic unit 15 to see whether or not the memory cell array 12 and the peripheral circuits are excellent for the standard mode.

The memory cell array 12 is implemented by a plurality of dynamic random access memory cells for storing data bits, and the peripheral circuits 13 allow an external device Ex such as, for example, a microprocessor to write and access data bits in the memory cell array 12. In order communicate with the external device Ex in the standard mode and with an external diagnostic system (not shown), the dynamic random access memory device is equipped with various signal pins such as address pins A0 to An, control signal pins assigned to a write enable signal WE, a column address strobe signal CAS, a row address strobe signal RAS, a data pin Dout and other signal pin Px, and these signal pins are coupled with the peripheral circuits 13. The control signal pins are hereinbelow labeled with the references designating the control signals WE, CAS and RAS. The address pins A1 and A2, the control signal pins WE, CAS, RAS and the control signal pin Px are further coupled with the instruction unit 14, and the instruction unit 14 sequentially controls the diagnostic unit 15 in the diagnostic mode under the supervision of the external diagnostic system. In this instance, the address pins A1 and A2 are first signal pins, and the control signal pins WE, CAS and RAS and the other control signal pin Px are second signal pins.

The diagnostic unit 15 has a plurality of test circuits 15a to 15i, and a plurality of inspection sequences are assigned to the plurality of test circuits 15a to 15i, respectively. For example, a parallel test operation on the memory cell array 12 is assigned to the test circuit 15i, and data bits concurrently read out from a predetermined number of memory cells are compared with one another to see whether or not all of the data bits are in consistence with one another. If all of the data bits are consistent with one another, the test circuit 15i supplies a consistent signal to the data output pin Dour.

Figure 4:
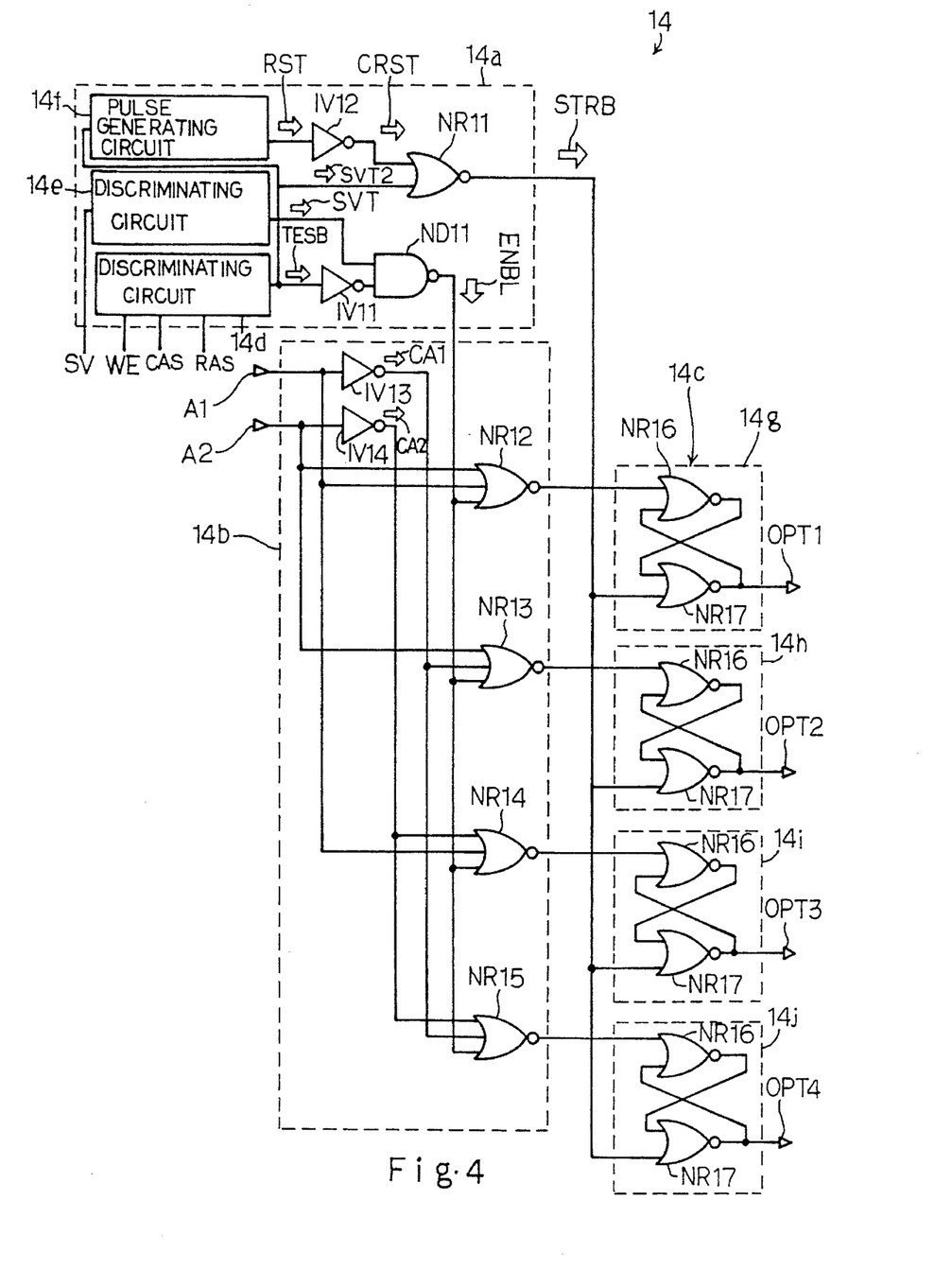
FIG. 4 is a circuit diagram showing the arrangement of an instruction circuit incorporated in the dynamic random access memory device according to the present invention

The instruction unit 14 comprises a control circuit 4a, a decoder circuit 14b and a latch circuit array 14c, and the latch circuit array 14c serves as resettable memory means.

The control circuit 14a has a discriminating circuit 14d coupled with the control signal pins WE CAS and RAS, and the discriminating circuit 14d monitors the control signal pins WE, CAS and RAS to see whether or not the WCBR entry cycle takes place. While no WCBR entry cycle takes place, the discriminating circuit 14d keeps a detecting signal TESB in inactive high voltage level corresponding to logic "1" level. However, when the discriminating circuit 14d acknowledges the WCBR cycle, the discriminating circuit 14d changes the detecting signal TESB to the active low voltage level corresponding to logic "0" level.

The control circuit 14a further comprises a discriminating circuit 14e coupled with the other control signal pin Px. A predetermined control signal is applied to the control signal pin Px in the standard mode, and swings voltage level within an ordinary range. However, the control signal pin Px is supplied with a super voltage SV in the diagnostic mode, and the super voltage SV is higher than the maximum voltage level in the ordinary range. The discriminating circuit 14e keeps the detecting signal SVT in inactive low voltage level in the absence of the super voltage SV at the control signal pin Px. However, when the discriminating circuit 14e acknowledges the super voltage SV at the control signal pin Px, the detecting signal SVT goes up to active high voltage level.

The control circuit 14a further comprises an inverter circuit IV11 and a NAND gate ND11, and the inverter circuit IV11 produces a complementary signal of the detecting signal TESB. The detecting signal SVT is directly supplied to the NAND gate ND11, and the inverter circuit IV11 supplies the complementary detecting signal to the NAND gate ND11. If both discriminating circuits 14d and 14e acknowledge the WCBR entry cycle and the super voltage SV, the NAND gate ND11 is enabled with the detecting signal SVT of logic "1" level, and the NAND gate ND11 produces an enable signal ENBL of logic "0" level from the complementary detecting signal. If the WCBR entry cycle is repeated in the presence of the super voltage SV, the NAND gate ND11 swings the enable signal ENBL between active logic "0" level and inactive logic "1" level.

The control circuit 14a further comprises a pulse generating circuit 14f, an inverter circuit IV12 and a NOR gate NR11, and the pulse generating circuit 14f produces a reset signal RST in a moment when the detecting signal TESB goes up to the active high voltage level. However, the pulse generating circuit 14f keeps the reset signal RST in the inactive low voltage level after the momentary production of the reset signal RST. The inverter circuit IV12 produces a complementary reset signal CRST, and the complementary reset signal CRST is supplied to the NOR gate NR11. While the super voltage SV is applied to the control signal pin Px, a disable signal SVT2 of logic "1" level is supplied from the discriminating circuit 14e to the NOR gate NR11, and the NOR gate NR11 fixes a strobe signal STRB to logic "0" level. However, if the super voltage SV is removed from the control signal pin Px, the disable signal SVT2 is recovered to inactive logic "0" level, and the NOR gate NR11 becomes responsive to the complementary reset signal CRST. In this situation, if the WCBR cycle takes place, the NOR gate NR11 allows the strobe signal STRB to go up to logic "1" level, and the latch circuit array 14c cancels the test enable signals stored therein. Therefore, the WCBR entry cycle in the absence of the super voltage is corresponding to a multi-bit external reset signal.

The decoder circuit 14b comprises two inverter circuits IV13 and IV14, and four NOR gates NR12, NR13, NR14 and NR15. The inverter circuits IV13 and IV14 produces complementary address bits CA1 and CA2, and the address bits A1 and A2 and the complementary address bits CA1 and CA2 are distributed to the NOR gates NR12 to NR15. The NOR gates NR12 to NR15 are simultaneously enabled with the enable signal ENBL, and decode the address bits A1 and A2. However, if the enable signal ENBL goes up to inactive logic "1" level, the NOR gates NR12 to NR15 are reset, and decodes the address bits A1 and A2 upon recovery of the enable signal ENBL to active logic "0" level. For this reason, if the enable signal ENBL is repeatedly swung between logic "0" level and logic "1" level, the decoder circuit 14b repeatedly decodes the address bits A1 and A2, and different combinations of the address bits A1 and A2 supplied in synchronism with the enable signal ENBL result in different decoded signals.

The latch circuit array 14c comprises four R-S flip flop circuits 14g, 14h, 14i and 14j, and the four R-S flip flop circuits 14g to 14j are respectively associated with the four NOR gates NR12 to NR15. Each of the R-S flip flop circuits 14g to 14j is implemented by two NOR gates NR16 and NR17, and the reset nodes of the R-S flip flop circuits 14g to 14j are coupled with the output node of the NOR gate NR11. The set nodes of the R-S flip flop circuits 14g to 14j are respectively coupled with the output nodes of the associated NOR gates NR12 to NR15, and the decoded signals are sequentially stored in the R-S flip flop circuits 14g to 14j in the presence of the strobe signal STRB.

Description is hereinbelow made on the behavior of the instruction circuit 14 with reference to FIG. 5 of the drawings. In order to shift the dynamic random access memory device to the diagnostic mode, the diagnostic system (not shown) applies the super voltage SV to the control signal pin Px, and the discriminating circuit 14e acknowledges the super voltage SV, thereby changing the detecting signal SVT to logic "1" level at time t11. With the detecting signal SVT, the NAND gate ND11 is enabled.

The diagnostic system (not shown) causes the column address strobe signal CAS and the write enable signal WE to go down at time t12, and changes the row address strobe signal RAS to the low voltage level at time t13. Then, the discriminating circuit 14d acknowledges the WCBR entry cycle, and changes the detecting signal TESB to logic "0" level. The inverter circuit IV11 supplies the complementary detecting signal of logic "1" level to the NAND gate ND11, and the NAND gate ND11 produces the enable signal of logic "0" level. For this reason, the NOR gates NR12 to NR15 are concurrently enabled with the enable signal ENBL of logic "0" level. Since the address bits A1 and A2 are in logic "0" level, the NOR gate NR12 produces the decoded signal of logic "1" level. The NOR gate NR11 is disabled with the detecting signal SVT of logic "1" level, and keeps the strobe signal STRB in logic "0" level. For this reason, the decoded signal of logic "1" level allows the R-S flip flop circuit 14g to produce the test enable signal OPT1 of logic "1" level.

The row address strobe signal RAS, the column address strobe signal CAS and the write enable signal WE go up to the high voltage level at time t14 for the reset cycle, and the NAND gate ND11 changes the enable signal ENBL to logic "1" level. The enable signal of inactive logic "1" level causes all of the NOR gates NR12 to NR15 to change the decoded signals to inactive logic "0" level. However, the R-S flip flop circuit 14g maintains the test enable signal OPT1.

The column address strobe signal CAS and the write enable signal WE go down to the low voltage level at time t15, and the row address strobe signal RAS goes down to the low voltage level at time t16. The discriminating circuit 14d acknowledges the WCBR entry cycle, and the NAND gate ND11 changes the enable signal to active logic "0" level again. Since the address bit A2 went up to the logic "1" level at time t14, the NOR gate NR13 changes the detecting signal to logic "1" level, and causes the R-S flip flop circuit 14h to change the test enable signal OPT2 to active logic "1" level.

The three external control signals RAS, CAS and WE are recovered to the high voltage level at time t17, and the enable signal ENBL is changed to inactive logic "1" level. However, the R-S flip flop circuits 14g and 14h continuously supply the test enable signals OPT1 and OPT2 of active logic "1" level to the diagnostic unit 15, and the diagnostic unit 15 starts two inspection sequences in parallel.

Figure 5:
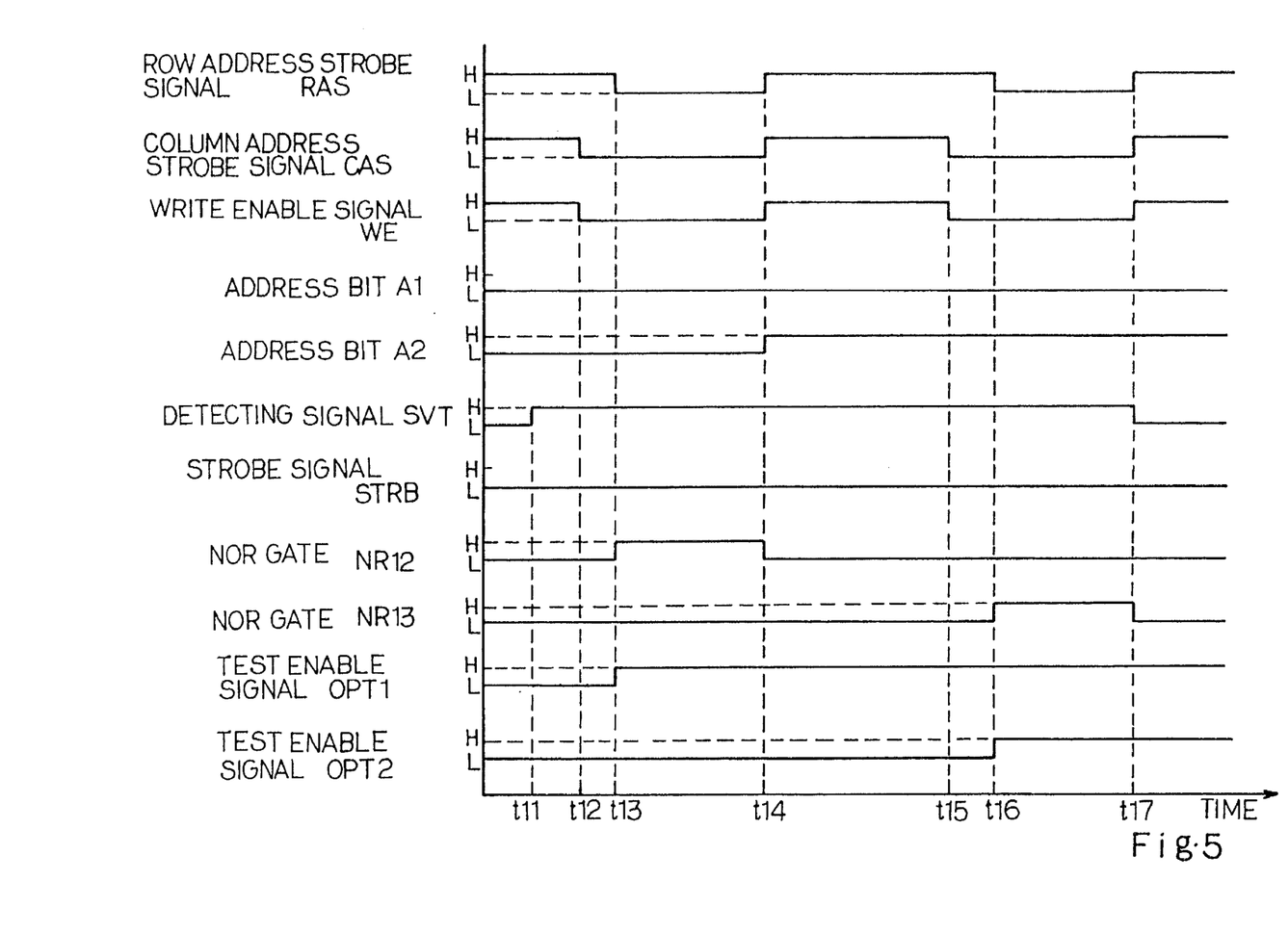
FIG. 5 is a timing chart showing a test mode entry cycle for the instruction circuit shown in FIG. 4.

Though not shown in FIG. 5, the WCBR cycle takes place in the absence of the super voltage upon completion of all the inspection sequences, and the strobe signal STRB of inactive logic "1" level resets all the R-S flip flop circuits 14g to 14j.

As will be appreciated from the forgoing description, according to the present invention, the external instruction signal constituted by the address bits A1 and A2 are decoded by the decoder circuit 14b, and the decoded signals are sequentially stored in the resettable memory means or the R-S flip flop circuits 14g to 14j, thereby allowing the diagnostic unit 15 to parallelize inspection sequences without increasing external signal pins.

Second Embodiment

Figure 6:
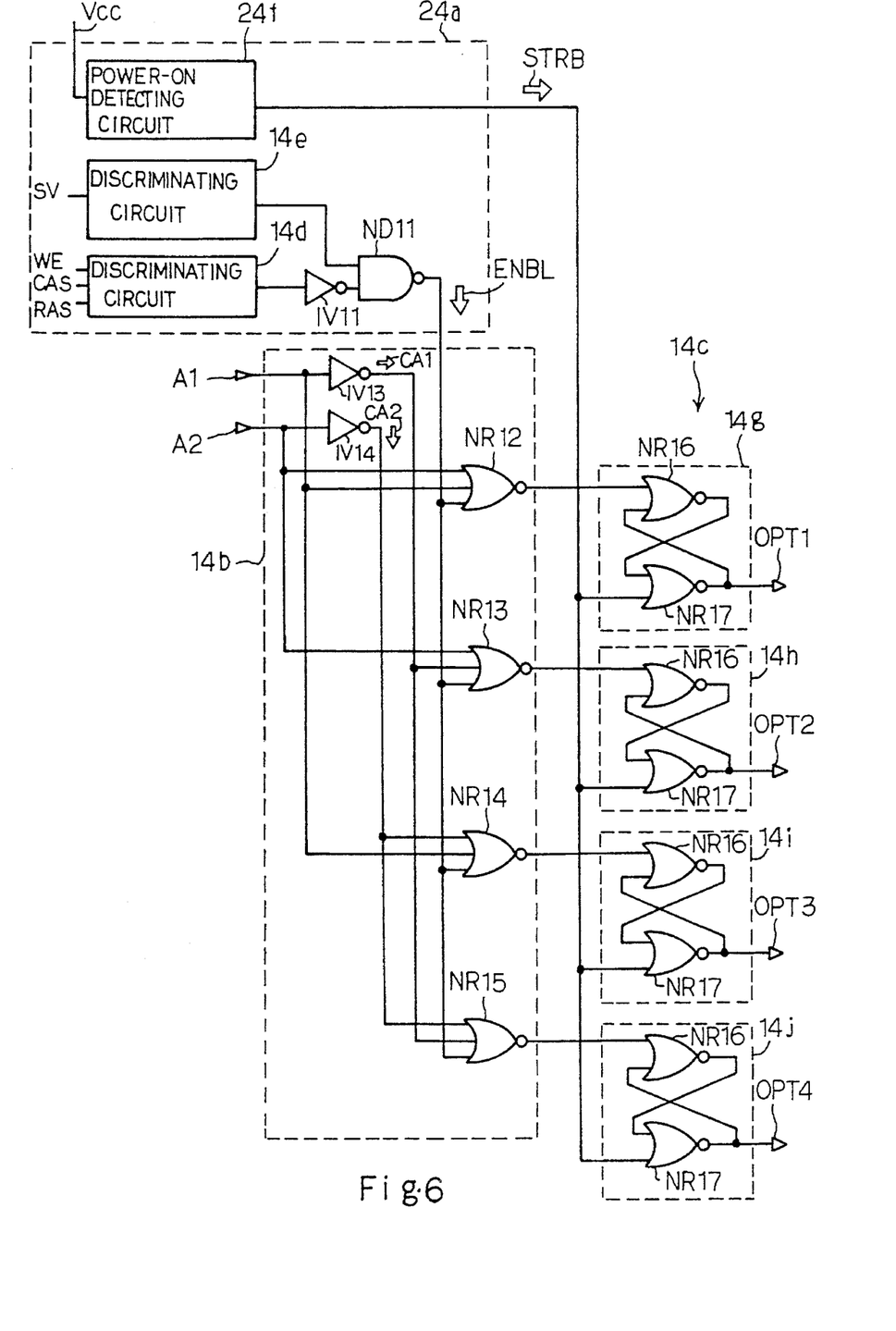
FIG. 6 is a circuit diagram showing the arrangement of an instruction circuit incorporated in another dynamic random access memory device according to the present invention.

Turning to FIG. 6 of the drawings, another instruction circuit is incorporated in a dynamic random access memory device embodying the present invention, and the pulse generating circuit 14f, the inverter circuit IV12 and the NOR gate NR11 are replaced with a power-on detecting circuit 24f. However, the other component circuits are similar to those of the first embodiment, and are labeled with the same references designating the corresponding component circuits of the first embodiment without any detailed description.

Figure 7:
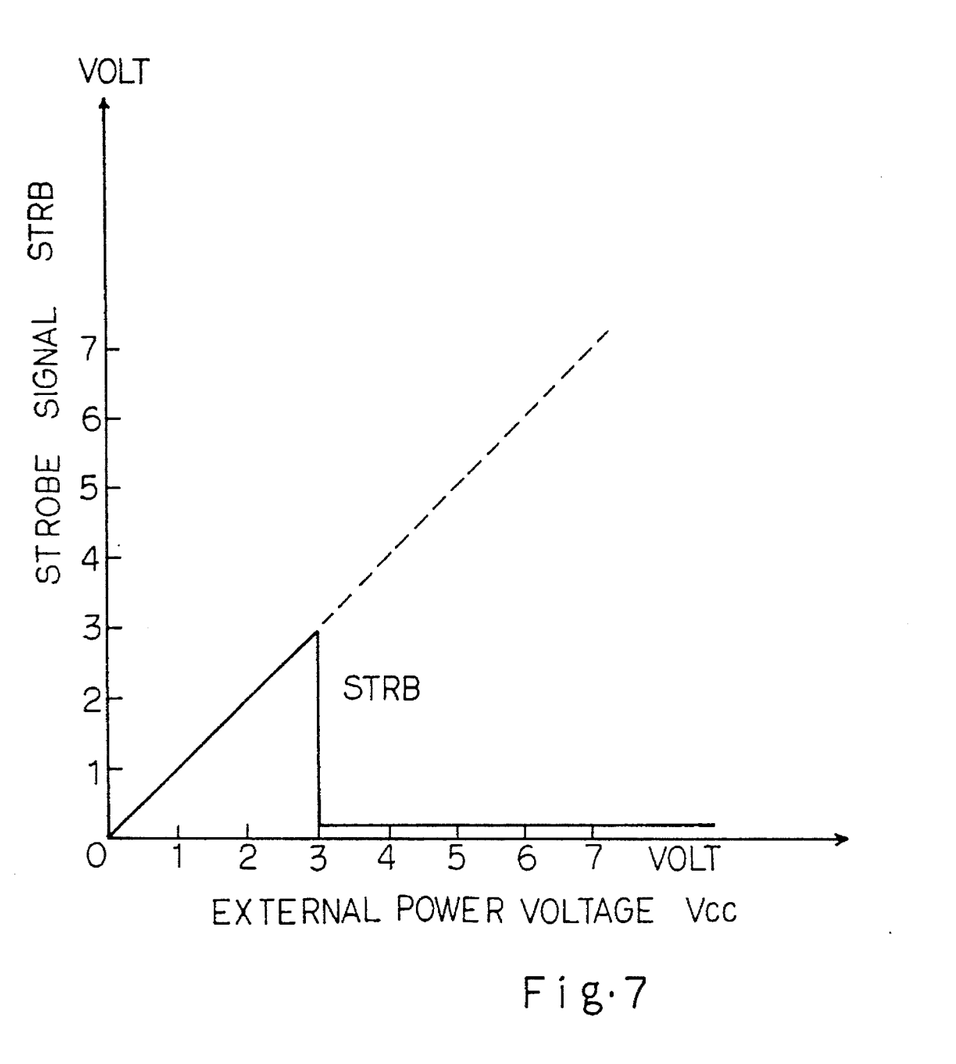
FIG. 7 is a graph showing the relation between an external power voltage and a power-on detecting signal used in the instruction circuit shown in FIG. 6.

The power-on detecting circuit 24f monitors a power voltage pin where an external power voltage Vcc is applied. As shown in FIG. 7, when an external power source (not shown) starts increasing the external power voltage vcc at the power voltage pin, the power-on detecting circuit 24f allows the strobe signal STRB to follow the external power voltage Vcc until 3 volts, and rapidly changes the strobe signal STRB to the low voltage level. Therefore, the R-S flip flop circuits 14g to 14j are reset by using the external power voltage Vcc, and any complex logic circuit is not necessary for producing the strobe signal STRB.

Although particular embodiments of the present invention have been shown and described, it will be obvious to those skilled in the art that various changes and modifications may be made without departing from the spirit and scope of the present invention. For example, the instruction circuit according to the present invention is available for any ultra large scale integration having a large number of internal inspection sequences, and, accordingly, the present invention may appertain to another type of semiconductor memory device such as, for example, a static type random access memory device or an electrically erasable and programmable read only memory device and to a microprocessor.

What is claimed is:

1. An instruction circuit incorporated in a semiconductor integrated circuit for selectively starting a plurality of internal inspection sequences, comprising:

a) a decoder circuit, coupled with first external signal pins of said semiconductor integrated circuit, which repeatedly decodes a plurality of multi-bit instruction signals at said first external signal pins while enabled by an enable signal for sequentially producing decoded signals at a plurality of output nodes of said decoder circuit;

b) a control circuit coupled with second external signal pins of said semiconductor integrated circuit, wherein said control circuit receives a multi-bit request signal via said second external pins, wherein said multi-bit request signal is indicative of an internal diagnosis, wherein said control circuit discriminates said multi-bit request signal for producing said enable signal, and wherein said control circuit produces a strobe signal when said internal diagnosis is requested; and c) a plurality of resettable memory means, respectively coupled with said output nodes of said decoder circuit, for storing said decoded signals while enabled by said strobe signal, wherein said plurality of resettable memory means simultaneously supplies a plurality of test enable signals to a diagnostic unit incorporated in said semiconductor integrated circuit, wherein said plurality of test enable signals are based on said decoded signals, and wherein each of said test enable signals is indicative of a request of particular inspection sequences selected from said plurality of internal inspection sequences to be performed by said diagnostic unit.

2. An instruction circuit as set forth in claim 1, in which said decoder circuit comprises:

a predecoding means for producing multi-bit complementary instruction signals from said multi-bit instruction signals, and a plurality of resettable logic gates enabled with said enable signal, wherein said plurality of resettable logic gates are selectively supplied with bits of said multi-bit instruction signals and bits of said multi-bit complementary instruction signals for sequentially producing said decoded signals.

3. An instruction circuit as set forth in claim 1, in which said control circuit comprises:

discriminating means coupled with said second external signal pins for producing said enable signal when said discriminating means acknowledges said multi-bit request signal, and a strobe signal generating means for producing said strobe signal to reset said plurality of resettable memory means either before beginning or after completion of said internal diagnosis.

4. An instruction circuit as set forth in claim 3, in which said discriminating means comprises a first discriminating circuit monitoring one of said second external signal pins for producing a first detecting signal when a super voltage outside an ordinary voltage range of an external signal is applied thereto, a second discriminating circuit monitoring the other second external signal pins for producing a second detecting signal when voltage levels thereat are indicative of an entry cycle, and a logic circuit enabled with said first detecting signal for producing said enable signal in the presence of said second detecting signal.

5. An instruction circuit as set forth in claim 4, in which said strobe signal generating means comprises a one-shot pulse generating circuit responsive to said second detecting signal for producing a one-shot pulse, and a logic circuit enabled with said first detecting signal for producing said strobe signal in the presence of said one-shot pulse.

6. An instruction circuit as set forth in claim 4, in which said strobe signal generating means comprises a power-on detecting circuit monitoring an external power voltage, and producing said strobe signal while said external power voltage is stable in active level, wherein said power-on detecting circuit produces a one-shot pulse for resetting said plurality of resettable memory means when said external power voltage starts increasing toward said active level.

7. An instruction circuit as set forth in claim 1, in which said plurality of resettable memory means are implemented by flip flop circuits.

8. A semiconductor memory device fabricated on a single semiconductor chip and selectively entering a standard mode and a diagnostic mode of operation, comprising:

a) a memory cell array implemented by a plurality of memory cells;

b) a plurality of peripheral circuits provided in association with said memory cell array for allowing an external device to selectively access data bits stored in said memory cell array in said standard mode of operation;

c) a diagnostic unit having a plurality of test circuits respectively activated with a plurality of test enable signals in said diagnostic mode for respectively carrying out a plurality of inspection operations on said memory cell array and peripheral circuits selected from said plurality of peripheral circuits; and d) an instruction unit which supplies said plurality of test enable signals to said diagnostic unit in said diagnostic mode, which is simultaneously supplying at least two of said plurality of test enable signals to said diagnostic unit, and which comprises:

d-1) a decoder circuit, coupled with first external signal pins of said semiconductor memory device, which sequentially decodes a plurality of multi-bit instruction signals on said first external signal pins when enabled by an enable signal for sequentially producing decoded signals at a plurality of output nodes of said decoder circuit, d-2) a control circuit, coupled with second external signal pins of said semiconductor integrated circuit, which discriminates a multi-bit request signal indicative of said diagnostic mode for producing said enable signal and which produces a strobe signal as a result of said multi-bit request signal, wherein said multi-bit request signal is supplied to said control circuit via said second external signal pins, and d-3) a plurality of resettable memory means, respectively coupled with said output nodes of said decoder circuit, for storing said decoded signals while enabled by said strobe signal, wherein said plurality of resettable memory means simultaneously supplies said at least two of said plurality of test enable signals to said diagnostic unit and wherein said test enable signals are based on said decoded signals.

9. An instruction circuit as set forth in claim 8, in which said decoder circuit comprises:

a predecoding means for producing a multi-bit complementary instruction signals from said multi-bit instruction signals, and a plurality of resettable logic gates enabled with said enable signal, wherein said plurality of resettable logic gates are selectively supplied with bits of said multi-bit instruction signals and bits of said multi-bit complementary instruction signals for sequentially producing said decoded signals.

10. An instruction circuit as set forth in claim 8, in which said control circuit comprises:

discriminating means coupled with said second external signal pins for producing said enable signal when said discriminating means acknowledges said multi-bit request signal, and a strobe signal generating means for producing said strobe signal to reset said plurality of resettable memory means either before beginning or after completion of said diagnosis.

11. An instruction circuit as set forth in claim 10, in which said discriminating means comprises a first discriminating circuit monitoring one of said second external signal pins for producing a first detecting signal when a super voltage outside an ordinary voltage range of an external signal used in said standard mode is applied thereto, a second discriminating circuit monitoring the other second external signal pins for producing a second detecting signal when voltage levels thereat are indicative of an entry cycle, and a logic circuit enabled with said first detecting signal for producing said enable signal in the presence of said second detecting signal.

12. An instruction circuit as set forth in claim 11, in which said strobe signal generating means comprises a one-shot pulse generating circuit responsive to said second detecting signal for producing a one-shot pulse, and a logic circuit enabled with said first detecting signal for producing said strobe signal in the presence of said one-shot pulse.

13. An instruction circuit as set forth in claim 10, in which said strobe signal generating means comprises a power-on detecting circuit monitoring an external power voltage, and producing said strobe signal while said external power voltage is stable in active level, wherein said power-on detecting circuit produces a one-shot pulse for resetting said plurality of resettable memory means when said external power voltage starts increasing toward said active level.

14. An instruction circuit as set forth in claim 8, in which said plurality of resettable memory means are implemented by flip flop circuits.

* * * * *